United States Patent
Tsai et al.

(10) Patent No.: US 7,842,169 B2
(45) Date of Patent: Nov. 30, 2010

(54) METHOD AND APPARATUS FOR LOCAL POLISHING CONTROL

(75) Inventors: Stan Tsai, Fremont, CA (US); Feng Q. Liu, San Jose, CA (US); Yan Wang, Sunnyvale, CA (US); Rashid Mavliev, Campbell, CA (US); Liang-Yuh Chen, Foster City, CA (US); Alain Duboust, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 428 days.

(21) Appl. No.: 10/382,032

(22) Filed: Mar. 4, 2003

(65) Prior Publication Data

US 2004/0173461 A1    Sep. 9, 2004

(51) Int. Cl.
*C25F 3/30* (2006.01)

(52) U.S. Cl. .................. 204/224 M; 204/228.1; 204/228.9; 204/260; 204/272; 205/640; 205/641; 205/646

(58) Field of Classification Search .......... 204/640, 204/400–435, 224 M, 228.9, 229.1, 229.8, 204/224 R, 242, 275.1, 228.1, 272; 205/81, 205/640, 123, 641, 646
See application file for complete search history.

(56) References Cited

U.S. PATENT DOCUMENTS

| | | | |
|---|---|---|---|
| 3,942,959 A | 3/1976 | Markoo et al. | |
| 3,992,178 A | 11/1976 | Markoo et al. | |
| 4,839,993 A | 6/1989 | Masuko et al. | |
| 5,061,294 A | 10/1991 | Harmer et al. | |
| 5,096,550 A | 3/1992 | Mayer et al. | |
| 5,108,463 A | 4/1992 | Buchanan | |
| 5,562,529 A | 10/1996 | Kishii et al. | |
| 5,637,031 A | 6/1997 | Chen | |
| 5,766,446 A | 6/1998 | Spindt et al. | |
| 5,766,466 A | 6/1998 | Peterson | |
| 5,823,854 A | 10/1998 | Chen | |
| 5,911,619 A | 6/1999 | Uzoh et al. | |
| 5,966,151 A | 10/1999 | Wakahara | 347/55 |
| 5,985,093 A | 11/1999 | Chen | |
| 6,051,116 A | 4/2000 | Ichinose et al. | |
| 6,056,851 A | 5/2000 | Hsieh et al. | |

(Continued)

FOREIGN PATENT DOCUMENTS

DE         3413762 A1    5/1983

(Continued)

OTHER PUBLICATIONS

PCT Notification of Transmittal of the International Search Report for PCT/US04/006385 dated May 17, 2005.

(Continued)

*Primary Examiner*—Roy King
*Assistant Examiner*—Lois Zheng
(74) *Attorney, Agent, or Firm*—Patterson & Sheridan, LLP

(57) ABSTRACT

A method and apparatus for local polishing and deposition control in a process cell is generally provided. In one embodiment, an apparatus for electrochemically processing a substrate is provided that selectively polishes discrete conductive portions of a substrate by controlling an electrical bias profile across a processing area, thereby controlling processing rates between two or more conductive portions of the substrate.

32 Claims, 11 Drawing Sheets

U.S. PATENT DOCUMENTS

| | | | |
|---|---|---|---|
| 6,068,818 A | 5/2000 | Ackley et al. .................. | 422/50 |
| 6,074,284 A | 6/2000 | Tani et al. | |
| 6,141,027 A | 10/2000 | Akutsu et al. ............... | 347/163 |
| 6,183,354 B1 | 2/2001 | Zuniga et al. | |
| 6,190,494 B1 | 2/2001 | Dow | |
| 6,261,433 B1 * | 7/2001 | Landau ......................... | 205/96 |
| 6,319,420 B1 | 11/2001 | Dow | |
| 6,358,118 B1 | 3/2002 | Boehm et al. | |
| 6,368,190 B1 | 4/2002 | Easter et al. | |
| 6,379,223 B1 | 4/2002 | Sun et al. | |
| 6,395,152 B1 | 5/2002 | Wang ..................... | 204/224 M |
| 6,402,925 B2 | 6/2002 | Talieh | |
| 6,431,968 B1 | 8/2002 | Chen et al. | |
| 6,440,295 B1 | 8/2002 | Wang | |
| 6,479,962 B2 | 11/2002 | Ziemkowski et al. | |
| 6,537,144 B1 | 3/2003 | Tsai et al. | |
| 6,612,904 B1 | 9/2003 | Boehm et al. | |
| 6,666,959 B2 | 12/2003 | Uzoh et al. | |
| 6,736,952 B2 | 5/2004 | Emesh | |
| 6,739,951 B2 | 5/2004 | Sun et al. | |
| 6,776,693 B2 | 8/2004 | Duboust et al. | |
| 6,802,955 B2 * | 10/2004 | Emesh et al. ................ | 205/662 |
| 2001/0027018 A1 | 10/2001 | Molnar | |
| 2002/0108861 A1 * | 8/2002 | Emesh et al. .................. | 205/81 |
| 2002/0123300 A1 | 9/2002 | Jones et al. | |
| 2003/0104762 A1 | 6/2003 | Sato et al. | |
| 2003/0129927 A1 | 7/2003 | Lee et al. | |
| 2003/0209448 A1 | 11/2003 | Hu et al. | |
| 2003/0213703 A1 | 11/2003 | Wang et al. | |
| 2004/0023610 A1 | 2/2004 | Hu et al. | |

FOREIGN PATENT DOCUMENTS

| | | |
|---|---|---|
| EP | 0 325 753 | 8/1989 |
| EP | 0 455 455 | 6/1991 |
| EP | 1 103 346 | 5/2001 |
| EP | 1 103 346 A2 | 5/2001 |
| EP | 1103346 A2 * | 5/2001 |
| GB | 2 214 520 A | 9/1989 |
| JP | 10-16213 | 1/1998 |
| JP | 2870537 | 1/1999 |
| JP | 11-042554 | 2/1999 |
| JP | 2000-218513 | 8/2000 |
| JP | 2001-77117 | 3/2001 |
| JP | 2001196335 | 7/2001 |
| JP | 2001-244223 | 9/2001 |
| JP | 2002093761 | 3/2002 |
| JP | 2002520850 | 7/2002 |
| JP | 2004209588 | 7/2004 |
| WO | WO-98-49723 | 11/1998 |
| WO | WO-99-41434 | 8/1999 |
| WO | WO 99/53119 | 10/1999 |
| WO | WO-00-03426 | 1/2000 |
| WO | WO-00-26443 | 5/2000 |
| WO | WO 2004/024394 | 5/2000 |
| WO | WO-00-33356 | 6/2000 |
| WO | WO-00-59682 | 10/2000 |
| WO | WO-01-13416 | 2/2001 |
| WO | WO-01-49452 | 7/2001 |
| WO | WO-01-52307 | 7/2001 |
| WO | WO-01-63018 | 8/2001 |
| WO | WO-01-71066 | 9/2001 |
| WO | WO-01-88229 | 11/2001 |
| WO | WO-01-88954 | 11/2001 |
| WO | WO 02/23616 | 3/2002 |
| WO | WO 02/64314 | 8/2002 |
| WO | WO 03/001581 | 1/2003 |
| WO | WO 03/061905 A1 | 7/2003 |

OTHER PUBLICATIONS

PCT Written Opinion for PCT/US04/006385 dated May 17, 2005.
D. Landolt, "Fundamental Aspects of Electropolishing", Mar. 18, 1996, pp. 1-11.
Partial International Search Report for US 02/40754 dated Apr. 28, 2003.
PCT International Preliminary Examination Report for PCT/US02/04806, dated Sep. 7, 2004.
PCT International Preliminary Examination Report for PCT/US03/06058, dated Sep. 7, 2004.
PCT International Search Report for US 02/04806 dated Apr. 1, 2003.
PCT International Search Report for US 03/06058 dated Jun. 25, 2003.
PCT Written Opinion for PCT/US02/04806, dated Mar. 9, 2004.
PCT Written Opinion for PCT/US03/06058, dated Feb. 13, 2004.
PCT International Search Report for PCT/US 02/11009 dated Feb. 6, 2003.
PCT International Search Report for PCT/US03/01760 dated May 27, 2003.
PCT International Search Report for PCT/US03/29230 dated Feb. 3, 2004.
PCT International Search Report dated Mar. 30, 2005 for PCT/US2004/007501.
PCT Written Opinion dated Mar. 30, 2005 for PCT/US2004/007501.
PCT Partial International Search Report for PCT/US04/006385 dated Mar. 22, 2005.
Contolini "Electrochemical Planarization of ULSI Copper," Solid State Technology; vol. 40, No. 6, Jun. 1, 1997, pp. 155-156, 158, 160, 162.
Nogami "An Innovation to Integrate Porous Low-K Materials and Copper", InterConnect Japan 2001; Honeywell Seminar (Dec. 6, 2001); pp. 1-12.
Alexander, et al., "Electrically Conductive Polymer Nanocomposite Materials," www.afrlhorizons.com/Briefs/Sept02/ML0206.html, Date Unknown.
PCT Written Opinion for PCT/US03/01760 dated Mar. 8, 2004.
PCT International Preliminary Report on Patentability dated Sep. 22, 2005 for PCT/US04/006385.
PCT Written Opinion dated Sep. 22, 2005 for PCT/US04/006385.
Office Action dated Feb. 16, 2010 for Japanese Patent Application No. 2006-509008.
Official Letter dated Mar. 1, 2010 for Taiwan Patent Application No. 93105760.
First Office Action for Chinese Patent Application No. 200480005812X issued Mar. 13, 2009.

* cited by examiner

METHOD AND APPARATUS FOR LOCAL POLISHING CONTROL

BACKGROUND OF THE INVENTION

1. Field of the Invention

Embodiments of the invention generally relate to a method and apparatus for local polishing control in an electrochemical mechanical polishing system.

2. Background of the Related Art

Electrochemical mechanical polishing generally removes material from a semiconductor substrate through an electrochemical/chemical or a combined electrochemical/chemical and mechanical process. In one example of an electrochemical mechanical polishing system, a substrate or wafer is retained on a substrate support in a feature side up orientation. A polishing head having a conductive polishing pad and an internal counter electrode is placed in contact with the feature side of the substrate. The polishing head and the substrate are moved relative to one another in a predefined polishing motion. An electrolytic polishing fluid is disposed on the substrate and provides a conductive path between the substrate and the counter electrode. The substrate is electrically biased through the conductive pad relative to the counter electrode to drive a dissolution reaction at the substrate's surface to polish the substrate.

Copper is one material that may be polished using electrochemical mechanical polishing. Typically, copper is polished utilizing a two step process. In the first step, bulk of the copper is removed, typically leaving some copper residue projecting above the substrate's surface. The copper residue is then removed in a second or over-polishing step.

However, the removal of copper residue may result in dishing of copper features below the plane of surrounding material, typically an oxide or other barrier layer. The amount of dishing typically is related to polishing chemistries and processing parameter utilized in the over polish step, along with the width of the copper features subjected to polishing. As the copper layer does not have a uniform thickness across the substrate, it is difficult to removes all the copper residue without causing dishing over some features while not removing all of the copper residue over others. Thus, it would be advantageous if some areas of copper may be selectively polished while not polishing other areas to yield complete copper residue removal and minimized dishing.

Therefore, there is a need for a method and apparatus for local polishing control in an electrochemical mechanical polishing system.

SUMMARY OF THE INVENTION

A method and apparatus for local polishing control in a process cell is generally provided. In one aspect of the invention, an apparatus for electrochemically processing a substrate is provided that selectively processes discrete conductive portions of a substrate by controlling an electrical bias profile across a processing area, thereby controlling processing rates between two or more conductive portions of the substrate.

In another aspect of the invention, a method for electrochemically processing a substrate is provided that includes the steps of contacting conductive features disposed on a substrate with a conductive polishing pad assembly, flowing electrolyte between the conductive features and a first counter electrode, and selectively processing discrete portions of the conductive features.

BRIEF DESCRIPTION OF THE DRAWINGS

A more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION

The words and phrases used herein should be given their ordinary and customary meaning in the art by one skilled in the art unless otherwise further defined herein. Chemical-mechanical polishing should be broadly construed and includes, but is not limited to, abrading a substrate surface by chemical activity, mechanical activity, or a combination of both chemical and mechanical activity. Electropolishing should be broadly construed and includes, but is not limited to, planarizing a substrate by the application of electrochemical activity. Electrochemical mechanical polishing (ECMP) should be broadly construed and includes, but is not limited to, planarizing a substrate by the application of electrochemical/chemical activity, or a combination of both electrochemical/chemical and mechanical activity to remove material from a substrate surface. Electrochemical mechanical plating process (ECMPP) should be broadly construed and includes, but is not limited to, electrochemically depositing material on a substrate and concurrently planarizing the deposited material by the application of electrochemical activity, or a combination of both electrochemical and mechanical activity.

Anodic dissolution should be broadly construed and includes, but is not limited to, the application of an anodic bias to a substrate directly or indirectly which results in the removal of conductive material from a substrate surface and into a surrounding electrolyte solution. Aperture should be broadly construed and includes, but is not limited to, a perforation, hole, opening, groove, channel, or passage formed partially or completely through an object. Additionally, the term substantially, as used to modifying the term planar, is intended to describe a surface on a macroscopic or global level and not surface roughness.

Figure 1:
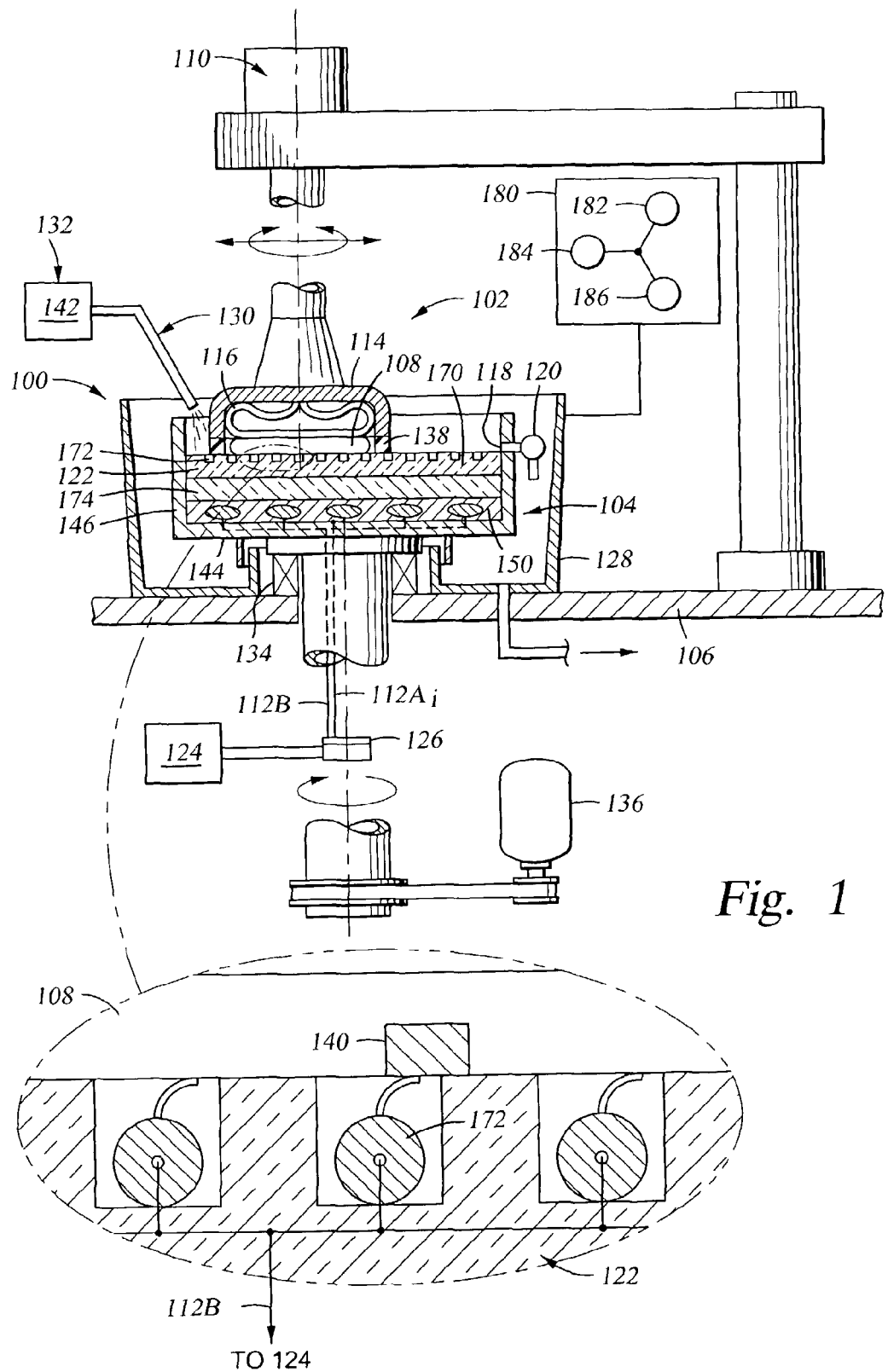
FIG. 1 is a sectional view of one embodiment of an electrochemical processing cell.

FIG. 1 depicts a sectional view of one embodiment of a process cell 100 in which at least one process comprising anodic dissolution and polishing processes may be practiced. While the first embodiment of the invention is described for an electrochemical-mechanical polishing (ECMP) process that utilizes a configurable electrical bias profile for selective polishing across the surface of a substrate, the invention contemplates using the application of a configurable electrical bias profile in other fabrication processes involving electrochemical activity. Examples of such processes using electrochemical activity include electrochemical deposition, which involves the application of a bias profile to a substrate surface for selectively depositing a conductive material without the use of a conventional bias application apparatus, such as edge contacts, and electrochemical mechanical plating processes (ECMPP) that include a combination of electrochemical deposition and chemical mechanical polishing.

The process cell 100 generally includes a polishing head 102 and a basin 104 that houses a conductive pad assembly 122 and a counter electrode assembly 150. A substrate 108, typically having one or more conductive surfaces 140, is retained in the polishing head 102 and lowered into the basin 104 during processing in a feature-down (e.g., backside up) orientation. The conductive surfaces 140 may include any one or combination of conductive material disposed in a feature, a layer of conductive material, or residue of conductive material remains on the substrate from a conductive layer. The substrate 108 and the conductive pad assembly 122 disposed in the basin 104 are moved relative to each other to provide a polishing motion. The polishing motion generally comprises at least one motion defined by an orbital, rotary, linear or curvilinear motion, or combinations thereof, among other motions. The polishing motion may be achieved by moving either or both of the polishing heads 102 and the basin 104. The polishing head 102 may be stationary or driven to provide at least a portion of the relative motion between the basin 104 and the substrate 108 held by the polishing head 102. Alternatively, the conductive pad assembly 122 may be moved, for example like a belt, while the polishing head 102 is stationary or in motion. In the embodiment depicted in FIG. 1, the polishing head 102 is coupled to a drive system 110. The drive system 110 moves the polishing head 102 with at least one of a rotary, orbital, sweep motion or combinations thereof.

In one embodiment, the polishing head 102 includes a housing 114 enclosing a bladder 116. The bladder 116 may be deflated when contacting the substrate to create a vacuum therebetween, thus securing the substrate to the polishing head 102. The bladder 116 may additionally be inflated to press the substrate in contact with the conductive pad assembly 122 retained in the basin 104. A retaining ring 138 is coupled to the housing 114 and circumscribes the substrate 108 to prevent the substrate from slipping out from the polishing head 102 while processing. One polishing head that may be adapted to benefit from the invention is a TITAN HEAD™ carrier head available from Applied Materials, Inc., located in Santa Clara, Calif. Another example of a polishing head that may be adapted to benefit from the invention is described in U.S. Pat. No. 6,159,079, issued Dec. 12, 2001, which is hereby incorporated herein by reference in its entirety.

The basin 104 is generally fabricated from a non-conductive material that is compatible with electroplating and/or electropolishing chemistries. The basin 104 includes a bottom 144 and sidewalls 146 that define a container that houses the conductive pad assembly 122 and the electrode assembly 150. The sidewalls 146 of the basin 104 are configured to retain electrolyte that makes conductive contact with the electrode assembly 150 and the substrate held by the polishing head 102 against the conductive pad assembly 122. The sidewalls 146 include a port 118 formed therethrough to allow removal of electrolyte from the basin 104. The port 118 is coupled to a valve 120 to selectively drain or retain the electrolyte in the basin 104.

The basin 104 is rotationally supported above a base 106 by bearings 134. A drive system 136 is coupled to the basin 104 and rotates the basin 104 during processing. A catch basin 128 is disposed on the base 106 and circumscribes the basin 104 to collect processing fluids, such as the electrolyte, that flow out of port 118 disposed through the basin 104 during and/or after processing.

An electrolyte delivery system 132 is generally disposed adjacent the basin 104 and is adapted to provide electrolyte to the basin 104. The electrolyte disposed in the basin 104 creates a conductive path between the counter electrode assembly 150 and conductive pad assembly 122 through the substrate's surface when the substrate 108 is in contact with the conductive pad assembly 122. The electrolyte delivery system 132 includes a nozzle or outlet 130 coupled to an electrolyte source 142. The outlet 130 flows electrolyte or other processing fluid from the electrolyte source 142 into the basin 104. During processing, the electrolyte generally provides an electrical path for biasing the substrate 108 and driving an electrochemical process to remove material from the substrate 108.

Electrolytes for copper containing material removal generally include inhibitors, cleating agents and pH adjusting agents. One electrolyte that can be used for electrochemical removal of metals from the substrate 108 is described in U.S. patent application Ser. No. 10/032,075, filed Dec. 21, 2001, which is hereby incorporated by reference in its entirety.

A multiple-output power source 124 is coupled to the counter electrode assembly 150 and conductive pad assembly 122 by electrical leads 112 (shown as 112$A_i$-B, where i is a positive integer greater than 1). The power source 124 applies an electrical bias between the counter electrode assembly 150 and the conductive pad assembly 122. The bias applied by each output of the power source 124 coupled to each of the leads 112Ai is independently controllable in magnitude, and typically may range between 0 to about 5 Volts DC. When the conductive pad assembly 122 is in contact with the substrate 108 in the presence of the electrolyte, the potential provided by the power source 124 drives an electrochemical process as described further below.

The leads 112 are routed through a slip ring 126 disposed below the basin 104. The slip ring 126 facilitates continuous electrical connection between the power source 124, electrode assembly 150 and the conductive pad assembly 122 as the basin 104 rotates. The leads 112 are wires, tapes or other conductors compatible with process fluids or having a covering or coating that protects the leads 112 from the process fluids. Examples of materials that may be utilized in the leads 112 include insulated graphite, titanium, platinum, gold, and HASTELOY® among other materials. Coatings disposed around the leads 112 may include polymers such as fluorocarbons, PVC, polyamide, and the like.

The conductive pad assembly 122 is coupled to the lead 112B that is routed (with leads 112$A_i$ that is coupled to the counter electrode assembly 150) through the bottom 144 of the basin 104 to the power source 124. The lead 112B may by coupled to the conductive pad assembly 122 by any number of methods that facilitate good electrical connection between the conductive pad assembly 122 and the power source 124, for example, by soldering, stacking, brazing, clamping, crimping, riveting, fastening, conductive adhesive or by other methods or devices that facilitate good electrical connection between the lead 112B and the conductive pad assembly 122. Optionally, the leads 112A$_I$-B may be coupled to the power source 124 using a single disconnect 266 (as shown in FIG. 2), disposed in the basin 104, to further facilitate replacement of either the conductive pad assembly 122 or counter electrode assembly 150.

The conductive pad assembly 122 includes a top pad 170 having a plurality of conductive elements 172, and an optional sub-pad 174. The sub-pad 174 is disposed between top pad 170 and the counter electrode assembly 150.

A controller 180 is coupled to the processing cell 100 to facilitate control of the voltages applied between the pad assembly 122 and the counter electrode assembly 150 by the power source 124. The controller 180 typically includes a central processing unit (CPU) 182, support circuits 186 and memory 184. The CPU 182 may be one of any form of computer processor that can be used in an industrial setting for controlling various subprocessors, substrate processing and cell functions. The memory 184 is coupled to the CPU 182. The memory 184, or computer-readable medium, may be one or more of readily available memory such as random access memory (RAM), read only memory (ROM), floppy disk, hard disk, or any other form of digital storage, local or remote. The support circuits 186 are coupled to the CPU 182 for supporting the processor in a conventional manner. These circuits include cache, power supplies, clock circuits, input/output circuitry, subsystems, and the like.

Figure 2:
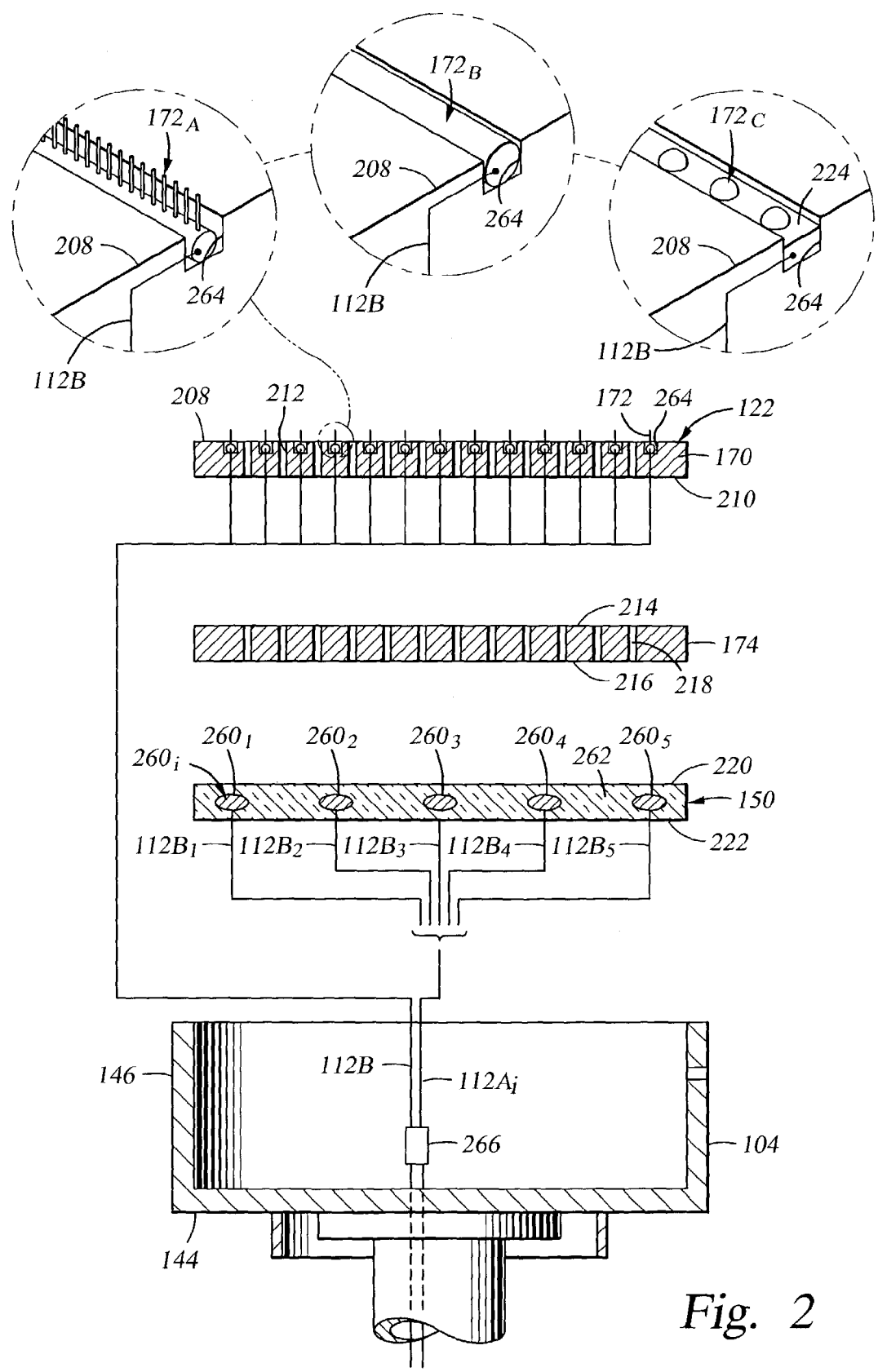
FIG. 2 is an exploded partial sectional view of the electrochemical processing cell of FIG. 1.

FIG. 2 depicts an exploded sectional view of one embodiment of the conductive pad assembly 122 and counter electrode assembly 150 that is removably disposed in the basin 104 of FIG. 1. The conductive pad assembly 122 depicted in FIG. 2 includes the top pad 170 coupled to the sub-pad 174. The sub-pad 174 is disposed on or coupled to the counter electrode assembly 150.

The top pad 170 is typically fabricated from polymeric materials compatible with process chemistry, examples of which include polyurethane, polycarbonate, fluoropolymers, PTFE, PTFA, polyphenylene sulfide (PPS), or combinations thereof, and other polishing materials used in polishing substrate surfaces. The top pad 170 may also contain fillers and/or be foamed. Exemplary conventional material includes those made from polyurethane and/or polyurethane mixed with fillers, which are commercially available from Rodel, Inc., headquartered in Phoenix, Ariz. Other conventional polishing materials, such as a layer of compressible material, may also be utilized for the top pad 170. Compressible materials include, but are not limited to, soft materials such as compressed felt fibers leached with urethane or foam. The top pad 170 is generally between about 10 to about 100 mils thick.

The top pad 170 has a first side 208 and a second side 210. The first side 208 is adapted to contact the substrate 108 (shown in FIG. 1) during processing. The first side 208 may include grooves, embossing or other texturing to promote polishing performance. The top pad 170 may be solid, impermeable to electrolyte, permeable to electrolyte or perforated. In the embodiment depicted in FIG. 2, the top pad 170 is perforated with a plurality of apertures 212 adapted to allow flow of electrolyte therethrough. The first side 208 additionally includes one or more slots 264 or other feature that retains the conductive elements 172 therein.

The conductive elements 172 may include conductive polymers, polymer composites with conductive materials, conductive metals or polymers, conductive fillers, graphitic materials, or conductive doping materials, or combinations thereof. The conductive elements 172 generally have a bulk resistivity or a bulk surface resistivity of about 10 Ω-cm or less.

In the embodiment depicted in FIG. 2, the conductive elements 172$_A$ are a plurality of electrically conductive fibers, stands and/or flexible fingers, such as carbon fibers or other conductive, compliant (i.e., flexible) material that facilitate electrical contact with the substrate while processing. In an alternative embodiment, the conductive elements 172$_B$ may be rollers, balls, rods, bars, mesh or other shape that facilitates conductive contact between the substrate disposed on the top pad 170 and the power source 124. In yet another alternative embodiment, the conductive elements 172$_C$ may be rollers, balls, rods, bars, mesh or other shape seated in a conductive carrier 224 that facilitates conductive contact between the substrate disposed on the top pad 170 and the power source 124.

Other types/configurations of conductive elements that may be utilized include tubing, springs, wire, tape, brushes, bars, mesh, cylinders, balls and pins. Examples of conductive pads that may be adapted to benefit from the invention are described in U.S. Provisional Patent Application Ser. No. 60/342,281, filed Dec. 19, 2001; U.S. Provisional Patent Application Ser. No. 60/326,263, filed Oct. 1, 2001; U.S. Provisional Patent Application Ser. No. 60/286,107, filed Apr. 24, 2001; U.S. patent application Ser. No. 10/140,010, filed May 7, 2002; and U.S. patent application Ser. No. 10/033,732, filed Dec. 27, 2001, all of which are incorporated herein by reference in their entireties. The conductive elements 172 may alternatively be intermixed in the top pad 170 to form a unitary body.

The sub-pad 174 is coupled to the second side 210 of the top pad 170. The sub-pad 170 is typically fabricated from a material softer, or more compliant, than the material of the top pad 170. The difference in hardness or durometer between the top pad 170 and the sub-pad 174 may be chosen to produce a desired polishing/plating performance. The sub-pad 174 may also be compressive. Examples of suitable backing materials include, but are not limited to, foamed polymer, elastomers, felt, impregnated felt and plastics compatible with the polishing chemistries.

The sub-pad 174 has a first side 214 and a second side 216. The first side 214 is coupled to the second side 210 of the top pad 170. The sub-pad 174 typically has a thickness in the range of about 5 to about 100 mils, and in one embodiment, is about 5 mils thick. The sub-pad 174 may be solid, impermeable to electrolyte, permeable to electrolyte or perforated. In one embodiment depicted in FIG. 2, the sub-pad 174 is configured to allow electrolyte therethrough, and may be permeable, have holes formed therethrough or a combination thereof. In the embodiment depicted in FIG. 2, the sub-pad 174 is perforated with a plurality of apertures 218 adapted to allow flow of electrolyte therethrough. The apertures 218 of the sub-pad 174 typically, but not necessarily, align with the apertures 212 of the top pad 170.

The counter electrode assembly 150 may be solid, impermeable to electrolyte, permeable to electrolyte, or perforated. The counter electrode assembly 150 has a first side 220 and a second side 222. The first side 220 of the counter electrode assembly 150 is coupled to the second side 216 of the sub-pad 174. In the embodiment depicted in FIG. 2, the counter electrode assembly 150 is configured to allow electrolyte therethrough. The counter electrode assembly 150 may be permeable, have holes formed therethrough or a combination thereof.

The second side 222 of the counter electrode assembly 150 may be adhered to the bottom 144 of the basin 104 with a removable adhesive to prevent the counter electrode assembly 150 from moving during polishing while allowing the counter electrode assembly 150 to be replaced. The counter electrode assembly 150 may alternatively be clamped, fastened or secured to the basin 104 by other methods.

The counter electrode assembly 150 may be a singular component or element, or part of a prefabricated assembly with the conductive pad assembly 122. One example of an electrode and conductive pad assembly that may be adapted to benefit from the invention is described in U.S. patent application Ser. No. 10/151,538, filed May 16, 2002, which is hereby incorporated by reference in its entirety.

In one embodiment, the counter electrode assembly 150 is fabricated from a plurality of electrodes $260_i$, spaced by one or more insulators 262. At least one of the electrode $260_i$ or insulators 262 is configured to allow electrolyte through the counter electrode assembly 150. The one or more insulators 262 are disposed between the electrodes $260_i$ to electrically isolate the electrodes $260_i$ from one another. The insulators 262 may be fabricated from any dielectric material suitable for use with process chemistries. The insulators 262 may be in the form of a web, egg-crate or other structure suitable for providing lateral electrical isolation between the electrodes $260_i$.

In the embodiment depicted in FIG. 2, the electrodes $260_i$ are disposed in or embedded in the insulator 262. The electrodes $260_i$ are typically comprised of the material to be deposited or removed, such as copper, aluminum, gold, silver, tungsten and other materials which can be electrochemically deposited on the substrate 108. For electrochemical removal processes, such as anodic dissolution, the electrodes $260_i$ may include a electrode of a material other than the deposited material. The electrodes $260_i$ may range in thickness from foils to greater than 100 mils thick.

Figure 3A:
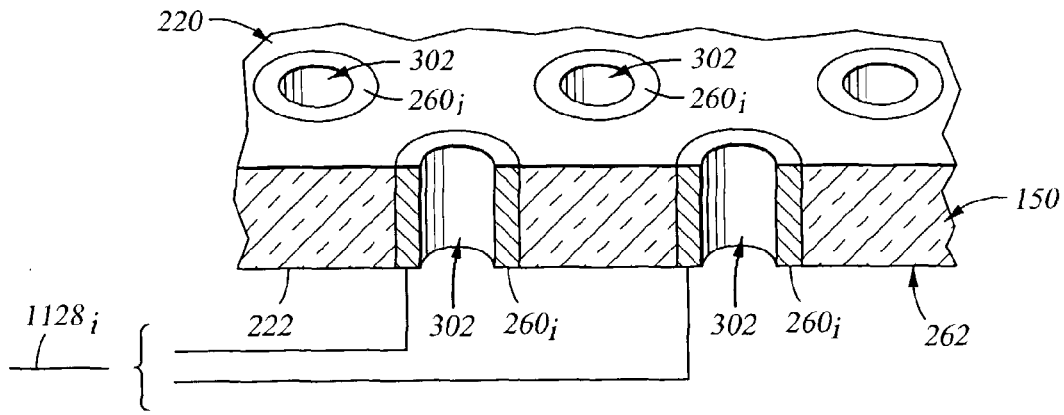
FIGS. 3A-C depict various embodiments of an electrode assembly.
Figure 3B:
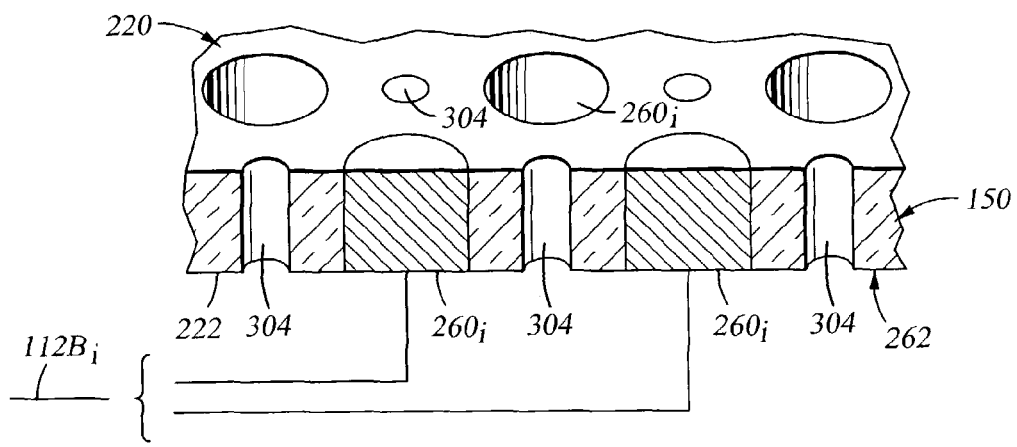
Figure 3C:
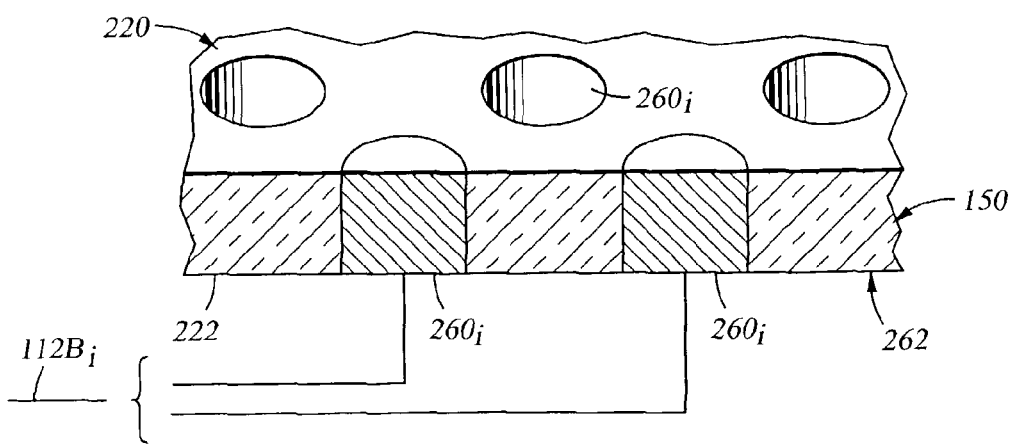

FIGS. 3A-C depict various embodiments of the electrodes $260_i$ and insulators 262. In the embodiment depicted in FIG. 3A, the electrodes $260_i$ are cylinders having a passage 302 disposed therethrough that allows passage of electrolyte through the counter electrode assembly 150. In the embodiment depicted in FIG. 3B, the electrodes $260_i$ are disposed in the insulator 262 that has a plurality of apertures 304 formed therethrough that allows passage of electrolyte through the counter electrode assembly 150. In the embodiment depicted in FIG. 3C, at least one of the electrodes $260_i$ or insulator 262 are at least one of perforated or permeable to electrolyte thereby allowing electrolyte through the counter electrode assembly 150 during processing.

Returning to FIG. 2, each of the electrodes $260_i$ (where i is a positive integer greater than 1, of which five are shown in FIG. 2) are coupled independently by the leads $112A_i$ to the power source 124, thereby allowing each electrode $260_i$, to be biased independently, and, when appropriate, at a different level than one of the other electrodes $260_i$. For example, an electrode $260_i$, may be biased to a voltage level greater than an electrode $260_2$. The independent biasing of the electrodes $260_i$ allows the substrate to be polished selectively at different rates across the diameter of the substrate.

Figure 4A:
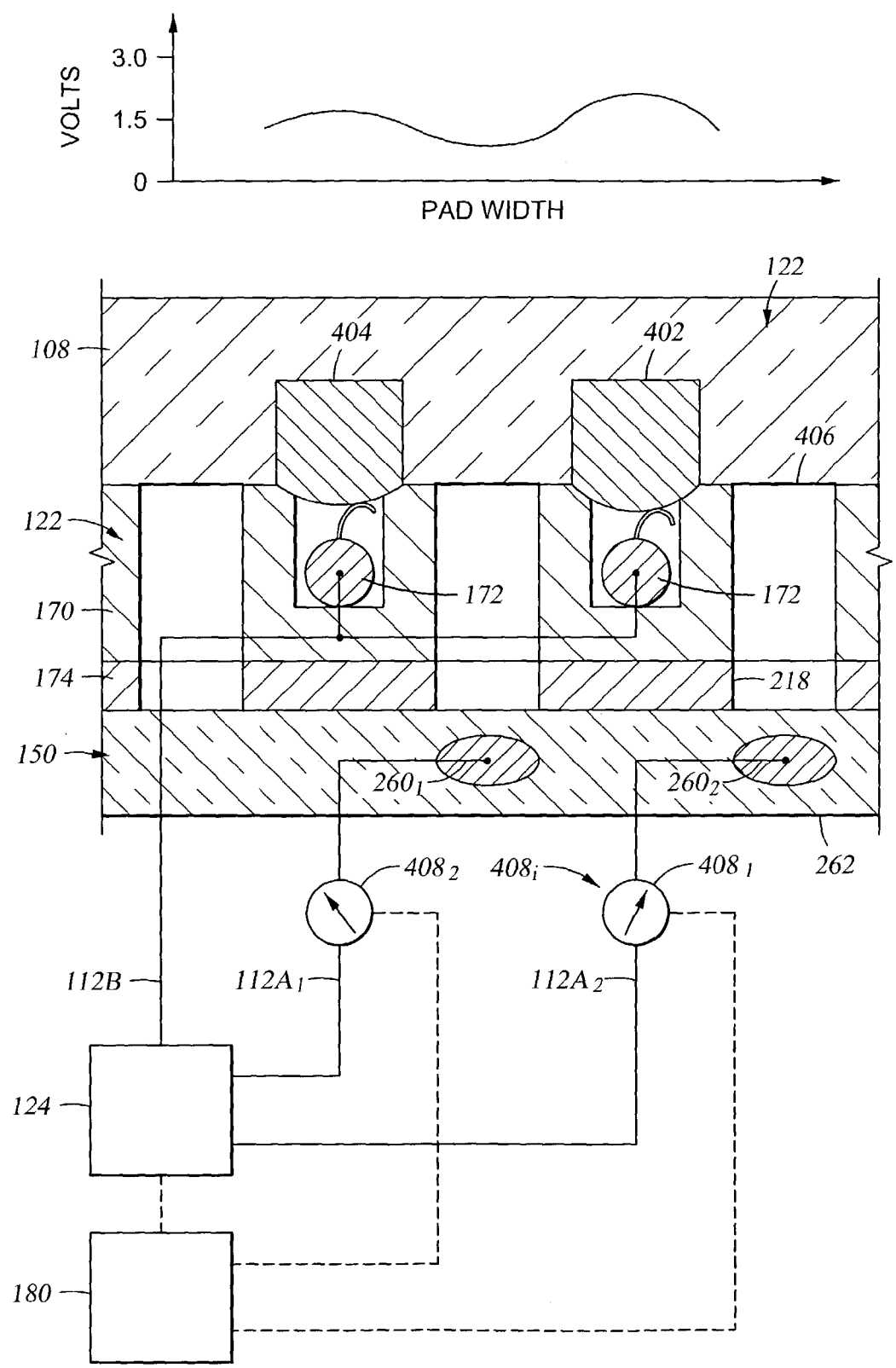
FIGS. 4A-C are simplified partial sectional views of a conductive pad and counter electrode assemblies illustrating a selective electrical bias profile.

FIG. 4A is a simplified partial sectional view of the counter electrode assembly 150 illustrating a selective electrical bias profile. The substrate 108 having a first conductive surface 402 and a second conductive surface 404 is depicted in contact with the conductive pad assembly 122. The conductive surfaces 402, 404 may be portions of a single conductive feature, or separate structures or residue of conductive material remains on the substrate from a conductive layer. In the embodiment depicted in FIG. 4A, the first conductive surface 402 and the second conductive surface 404 are at different elevations relative to a reference surface 406 of the substrate 108, with the first conductive surface 402 extends farther from the reference surface 406 than the second conductive surface 404. It is contemplated that the first conductive surface 402 and/or the second conductive surface 404 may be recessed from the reference surface 406.

In order to polish the first conductive surface 402 and the second conductive surface 404 to a common plane (typically defined by the reference surface 406), a first voltage is applied to the electrode $260_1$ while a second voltage is applied to the electrode $260_2$. It is contemplated that the first conductive surface 402 may represent residue from a layer of conductive material and that, as a result of the localized polishing, the first conductive surface 402 is removed to expose the underlying reference surface 406. If the first voltage is less than the second voltage, resulting in a greater current density between the electrode $260_2$ and the conductive pad assembly 122, which causes the first conductive surface 402 to be polished at a faster rate than the second conductive surface 404. Conversely, more voltage may be applied to the electrode $260_1$, which causes the second conductive surface 404 to be polished faster than the first conductive surface 402.

Control of the polishing rates is facilitated by a plurality of sensors $408_i$ that detect the desirability to polish the surfaces 402, 404 differently. In the embodiment depicted in FIG. 4A, the sensors $408_i$ (illustratively shown as sensor $408_1$, and sensor $408_2$) are current sensors disposed between the electrodes $260_i$ and the power source 124. As the distance between the elements 402, 404 and the electrode assembly 150 influences the current flux across that gap, current flow at each location (i.e., at elements 402, 404) is indicative of the elevation of each feature 402, 404 relative to the electrode assembly 150 and reference plane 406 of the substrate 108. Alternatively, the sensors $408_i$ may be voltage sensors or other sensors capable of detecting heights of the surfaces 402, 404 to the reference plane 406.

Each sensor $408_i$ is coupled to the controller 180 to provide feed back as to the topography of the conductive surfaces of the substrate 108. As the substrate 108 is moved in relation to the conductive pad assembly 122 during processing, the sensors $408_i$ update the relative position of each conductive surface across the width of the substrate 108. The controller 180, in response to information provided by the sensors $408_i$, causes the power source 124 to independently provide predetermined voltages to each of the electrode $260_i$ at a magnitude corresponding to a desired polishing rate that the locations of the substrate 108 disposed in contact with a particular conductive elements 172 associated with the sensors $408_i$ at that instant in time. Thus, the bias profile of the conductive pad assembly 122 may be continually adjusted to polish by anodic dissolution faster at substrate locations having conductive topography at higher elevations relative to the reference plane 406 of the substrate, advantageously polishing conductive topography at lower elevations at a slower rate, thus improving polishing performance and minimizing dishing.

It is also contemplated, for example in embodiments where the first conductive surface 402 is recessed from the reference surface 406, the power source 124 may bias the first conductive surface 402 with a polarity that results in deposition of conductive material from the electrolyte and/or electrode thereon. Deposition may occur at the first conductive surface 402 while also depositing material on the second conductive surface 404 or removing material from the second conductive surface 404.

Figure 4B:
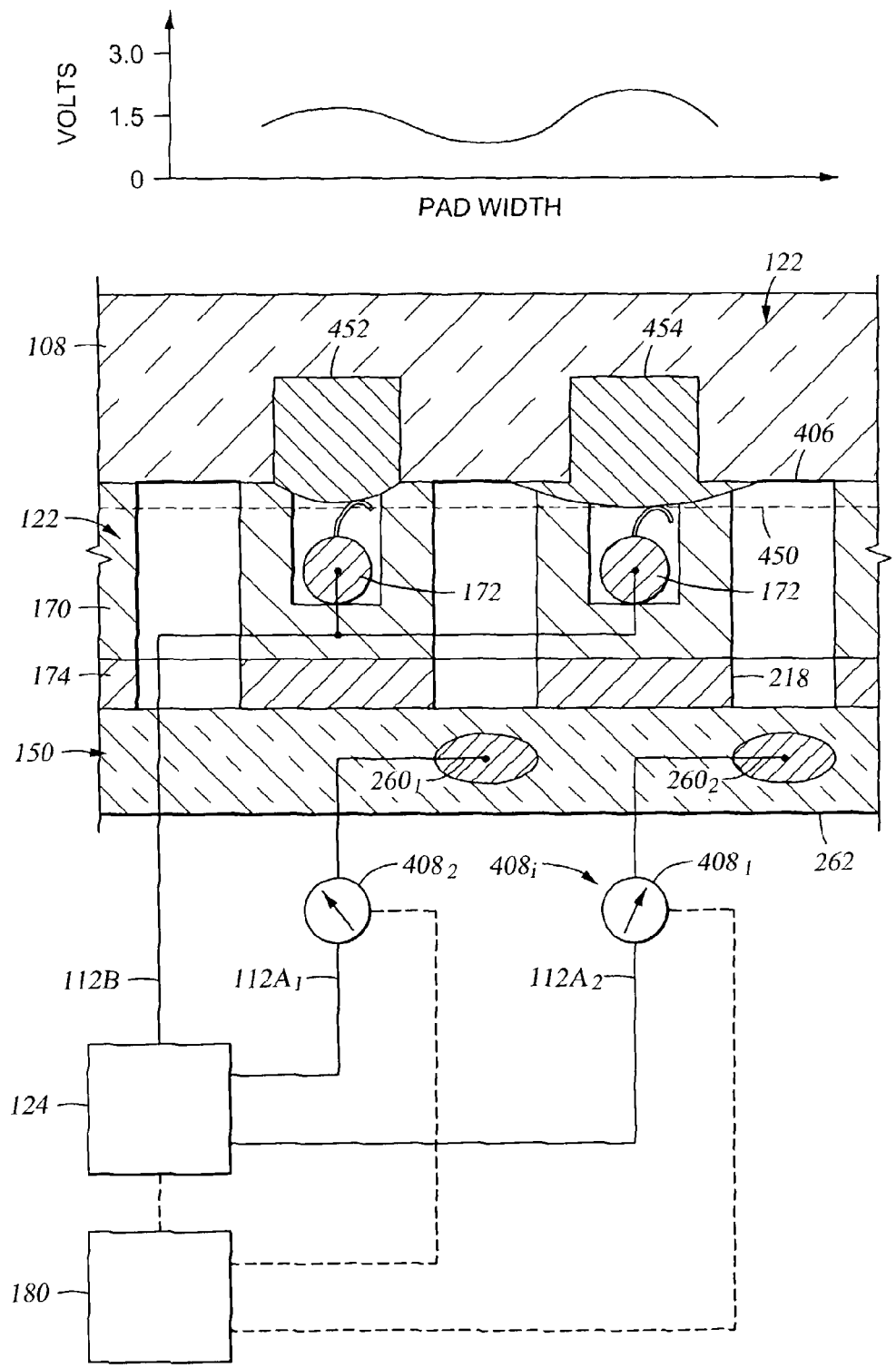

In another mode of operation depicted in FIG. 4B, the sensors $408_i$ may be utilized to detect differences in the exposed area of surfaces 452, 454 relative to the reference plane defined by the surface 406. For example, the first conductive surface 452 being an exposed surface of a filled feature will have a current flux greater than the second conductive surface 454 that is residue from the conductive layer 450 (shown in phantom) being removed. As the surface area of the second conductive surface 454 decreases, the current flux decreases ultimately to approximately zero, indicating the removal of the second conductive surface 454 (e.g., the residue) from the surface 406.

Figure 4C:
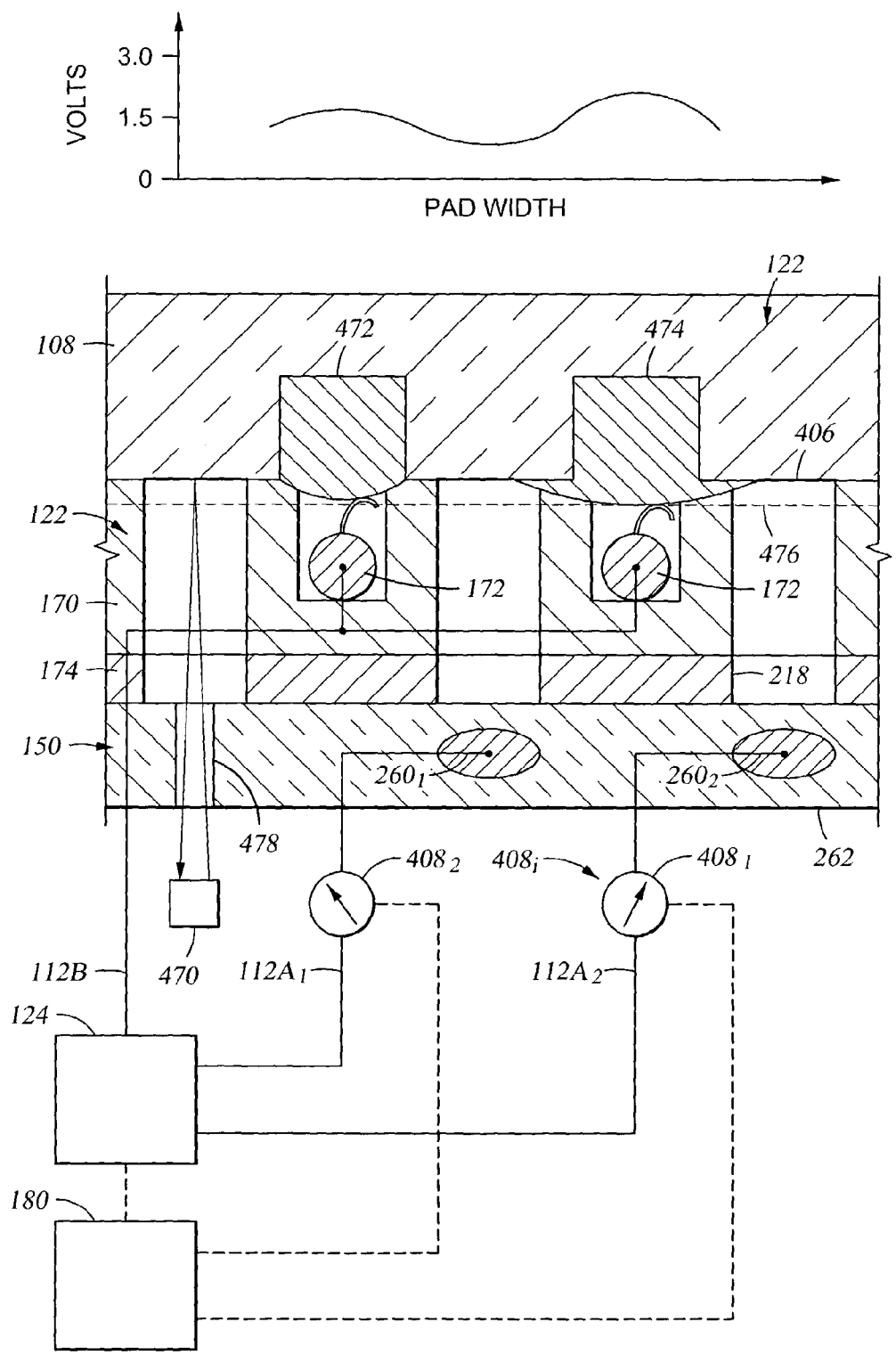

In another mode of operation depicted in FIG. 4C, a sensor 470 may be utilized to detect differences in the exposed area of surfaces 472, 474 relative to the reference plane defined by the surface 406. The sensor 470 is configured to detect the amount of reflectivity between the surfaces 406, 472 and 474. The sensor 470 generally generates a beam of light that passes through a window 478 formed in the polishing surface. The beam reflects off the substrate and back to the sensor 470, wherein the intensity of the reflected beam is indicative of the composition of the substrate. For example, the first conductive surface 472 being an exposed surface of a filled feature, which is typically one of a repeating number of feature formed across the width of the substrate, will have a greater reflectivity than the second conductive surface 474 that is residue from the conductive layer 476 (shown in phantom) being removed. Thus, differences in the amount of reflected light from the substrate is indicative of areas having features and residue. As the surface area of the second conductive surface 474 decreases, the current flux decreases ultimately to approximately zero, indicating the removal of the second conductive surface 474 from the surface 406.

Figure 5A:
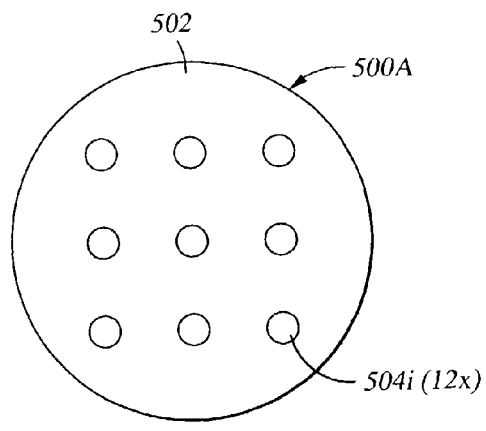
FIGS. 5A-C are top views of various embodiments of conductive pad assemblies having different conductive element layouts.
Figure 5B:
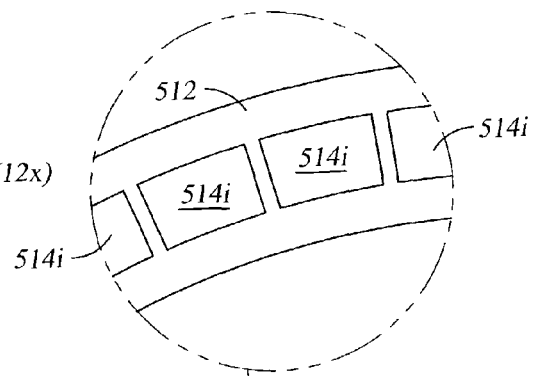
Figure 5C:
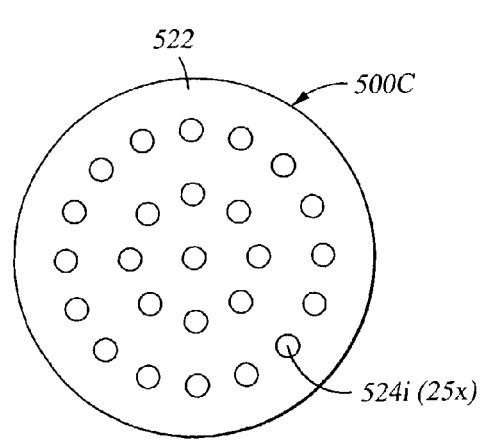

FIGS. 5A-C are top views of various embodiments of counter electrode assemblies having different conductive element layouts. It is contemplated that the electrodes may be configured in any number of orientations on the counter electrode assembly to facilitate control over the bias profile so that discrete portions of the substrate may be selectively polished as the substrate moves relative to the conductive pad and counter electrode assemblies.

FIG. 5A is a top view of one embodiment of a counter electrode assembly 500A. The counter electrode assembly 500A includes a plurality of electrodes $504_i$ that are adapted to electrically drive processing of discrete conductive portions of the substrate. The electrodes $504_i$ are arranged in a grid pattern across a top surface 502 of the counter electrode assembly 500A and may be selectively energized with a predetermined voltage level to control the local polishing rates on the substrate.

FIG. 5B is a top view of one embodiment of a counter electrode assembly 500B. The counter electrode assembly 500B includes a plurality of electrodes $514_i$ that are arranged in a radial pattern on a top surface 512 of the counter electrode assembly 500B. The radial pattern of electrodes $514_i$ may comprise concentric rings of electrodes $514_i$. Each ring may be configured from a single or a plurality of electrodes $514_i$ that may be selectively energized with a predetermined voltage level to control the local polishing rates on the substrate.

FIG. 5C is a top view of one embodiment of a counter electrode assembly 500C. The counter electrode assembly 500C includes a plurality of electrodes $524_i$ that are arranged in a polar array on a top surface 522 of the counter electrode assembly 500C. The electrodes $524_i$ may be selectively energized with a predetermined voltage level to control the local polishing rates on the substrate. Other arrangements of electrodes $524_i$ are also contemplated.

Figure 6:
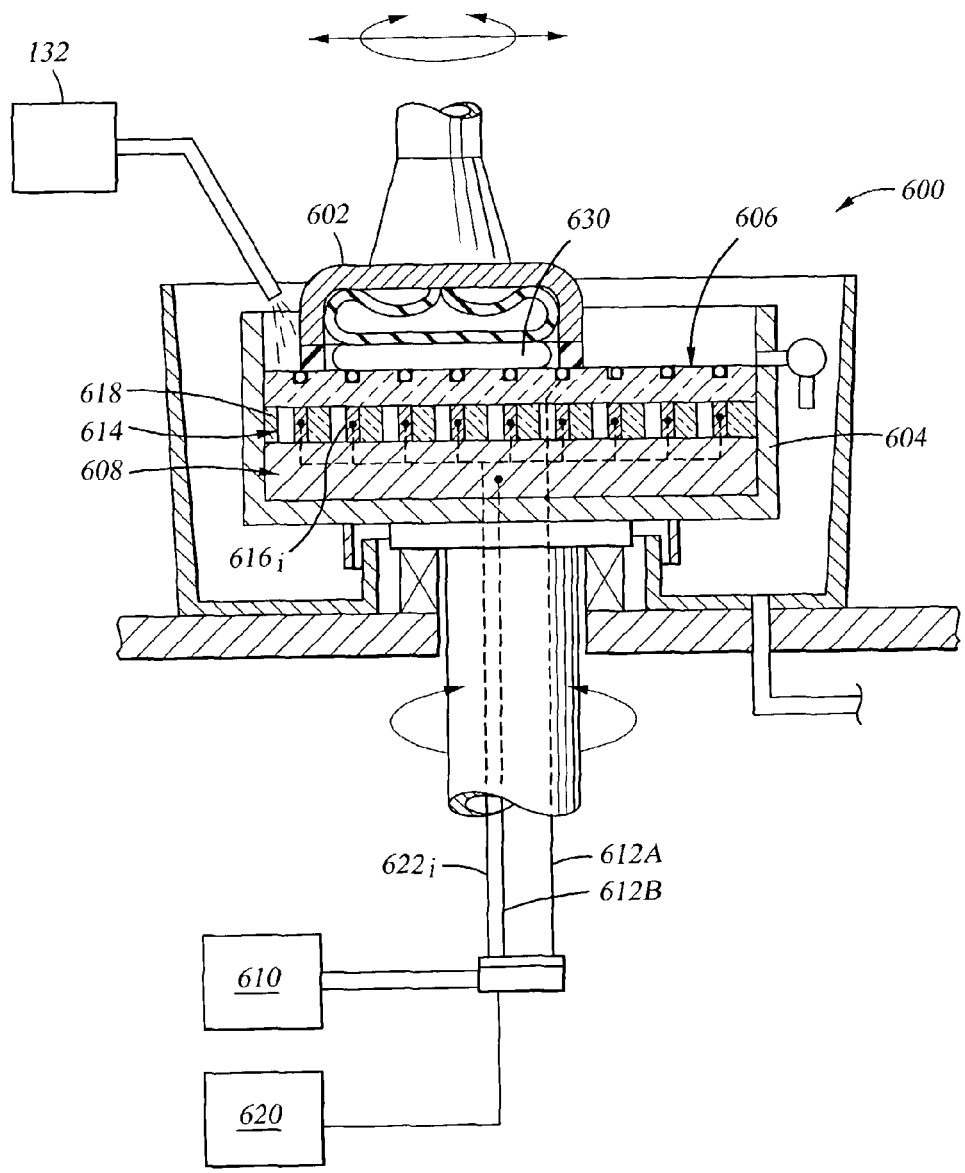
FIG. 6 is a sectional view of another embodiment of an electrochemical processing cell.

FIG. 6 is another embodiment of a process cell 600 in which at least one process comprising anodic dissolution and polishing process may be practiced. The process cell 600 generally includes a polishing head 602, conductive pad assembly 606 and a basin 604 that houses a conductive pad assembly 606, an electrode assembly 614 and a counter electrode assembly 608. The polishing head 602 and the basin 604 are generally similar to the polishing head 102, conductive pad assembly 122 and the basin 104 described above. An electrolyte delivery system 132 provides electrolyte to the basin 604 during processing.

The conductive pad assembly 606 and the counter electrode assembly 608 are coupled to a first power source 610 by electrical leads 612A-B. The first power source 610 applies an electrical bias between the counter electrode assembly 608 and the conductive pad assembly 606. The bias applied across the pad and counter electrode assemblies 606, 608 typically ranges between 0 to about 5 Volts DC. When the conductive pad assembly 606 is in contact with a substrate 108 in the presence of the electrolyte, the potential provided by the first power source 610 drives an electrochemical process as described further below.

The electrode assembly 614 disposed between the pad assembly 606 and the counter electrode assembly 608. The electrode assembly 614 is configured to allow the electrolyte to move between the pad assembly 606 and the counter electrode assembly 608 so that the electrolyte establishes a conductive path between a substrate 630 disposed on the pad assembly 606 and the counter electrode assembly 608.

The electrode assembly 614 is comprised of a plurality of independently biasable electrodes $616_i$ laterally insulated from each other by one or more dielectric members 618. The electrodes $616_i$ may be consumable or non-consumable and may be fabricated from materials similar to those identified as suitable for the counter electrodes discussed above. The dielectric member 618 is typically formed from a material compatible with process chemistries and of sufficient dielectric strength to laterally isolate the electrodes $616_i$ at process voltages.

At least one of the electrodes $616_i$ or the dielectric member 618 is porous, perforated, permeable or otherwise configured to allow passage of the electrolyte therethrough. Alternatively, the electrodes $616_i$ and the dielectric member 618 may be arranged to define passages that allow the electrolyte through the electrode assembly 614.

A multiple-output power source 620 is coupled respectively by leads $622_i$ to each of the electrodes $616_i$. The power source 620 allows each of the electrodes $616_i$ to be independently biased to control a local polishing rate adjacent each electrode $616_i$ by increasing (or decreasing) the current flux at surface of the substrate adjacent the respective electrode $616_i$.

Figure 7:
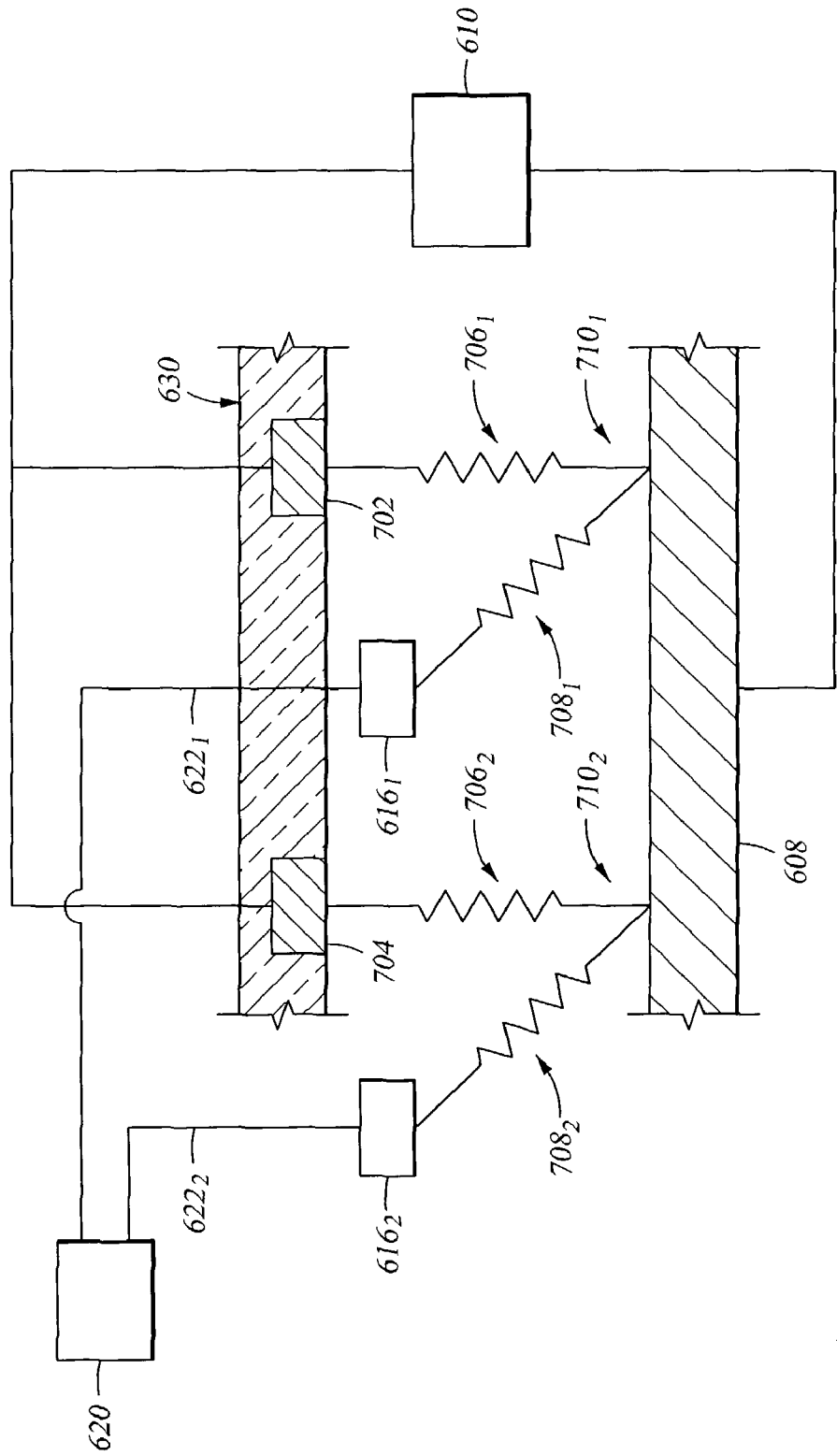
FIG. 7 a simplified partial electrical schematic of the processing cell of FIG. 6.

FIG. 7 is a simplified partial electrical schematic of the process cell 600. The substrate 630 is shown having a first conductive feature 702 and a second conductive feature 704. The conductive features 702, 704 are electrically coupled to the first power source 610 by the conductive pad assembly 606 (not shown in FIG. 7) and biased relative to the counter electrode assembly 608.

A first conductive path $710_1$ is defined through the electrolyte disposed between the first conductive feature 702 and the counter electrode assembly 608. The first conductive path $710_1$ is comprised of two circuit branches $706_1$, $708_1$. The amount of current flowing through the first branch $706_1$ of the first conductive path $710_1$ is controlled in part by the potential applied by the first power source 610. The current flowing through the first branch $706_1$ of the first conductive path $710_1$ is regulated in response to a voltage applied by the second power source 620 to the first electrode $616_1$ that is disposed between the first conductive feature 702 and the counter electrode assembly 608 (the electrodes are shown offset for clarity of the schematic of FIG. 7). As the electrode $616_1$ become biased with a voltage of same polarity and approaching (or exceeding) the potential of the first conductive feature 702 relative to the counter electrode assembly 806, the amount of current flowing between the first conductive feature 702 and the counter electrode assembly 608 through the first branch $706_1$ decreases, thus slowing the rate of material removal from the first conductive feature 702. Conversely, as the bias of the electrode $616_1$ becomes more disparate compared to the potential of the first conductive feature 702 relative to the counter electrode assembly 806, the amount of current flowing between the first conductive feature 702 and the counter electrode assembly 608 through the first branch $706_1$ increase, thus increasing the rate of material removal from the first conductive feature 702.

A second conductive path $710_2$ is similarly configured having of a first circuit branch $706_2$ and a second circuit branch $708_2$. The amount of current flowing through the first branch $706_2$ of the second conductive path $710_2$ is controlled in part by the potential applied by the first power source 610. The current flowing through the second branch $706_2$ of the second conductive path $710_2$ is regulated in response to a voltage applied to the second electrode $616_2$ by the second power source 620. As the second power source 620 independently controls the voltage to each electrode $616_i$, the current flowing through the first branch $706_i$ of each conductive path $710_i$ may be tailored to independently control the relative rate of material removal from each conductive feature disposed across the width of the substrate 630.

Figure 8:
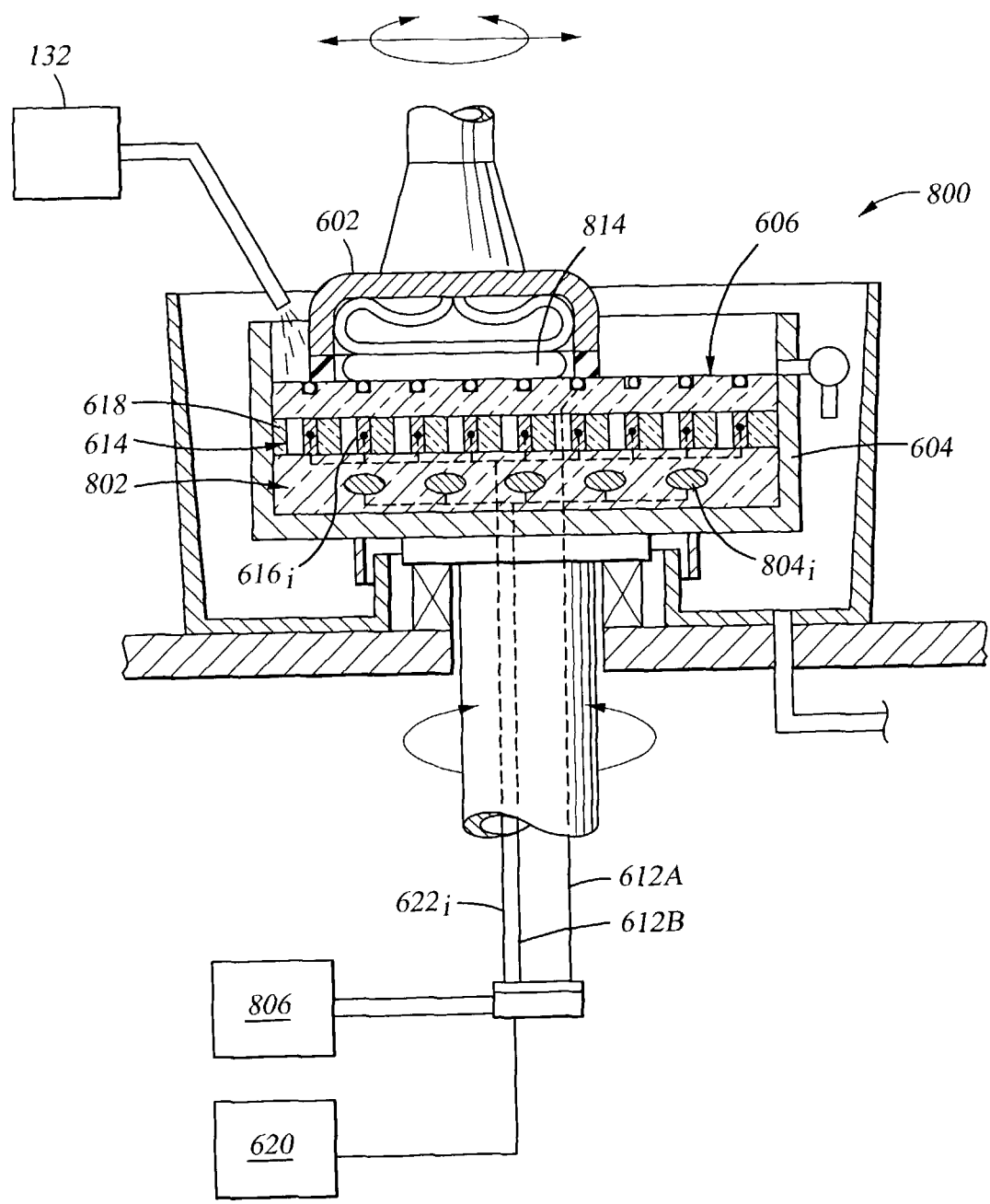
FIG. 8 is a sectional view of another embodiment of an electrochemical processing cell.

FIG. 8 is another embodiment of a process cell 800 for processing a substrate 814 configured similar to the process cell 600 described above, except that the process cell 800 includes a counter electrode assembly 802 and a plurality of electrodes 804, coupled to a power source 806. In one embodiment, the power source 806 is potentiostat, such as those available from Princeton Applied Research, that allows each of the electrodes $804_i$ to be independently biased relative to counter electrode assembly 802. Thus, the power source 806 may apply a potential to the electrodes $804_i$ that controls the local current flow along each of the conductive paths formed between the conductive features of the substrate and the counter electrode assembly 802, thereby allowing control of the polishing rate across the diameter of the substrate. Optionally, sensors (not shown) may be utilized as described above to facilitates closed loop control of substrate processing.

Yet another embodiment of a process cell for processing a substrate is configured similar to the process cell 600 described above, except that the process cell includes a counter electrode assembly having a plurality of independently biasable counter electrodes coupled to a first multiple output power source. The independently biasable counter electrodes facilitates closed loop control of substrate processing.

Figure 9:
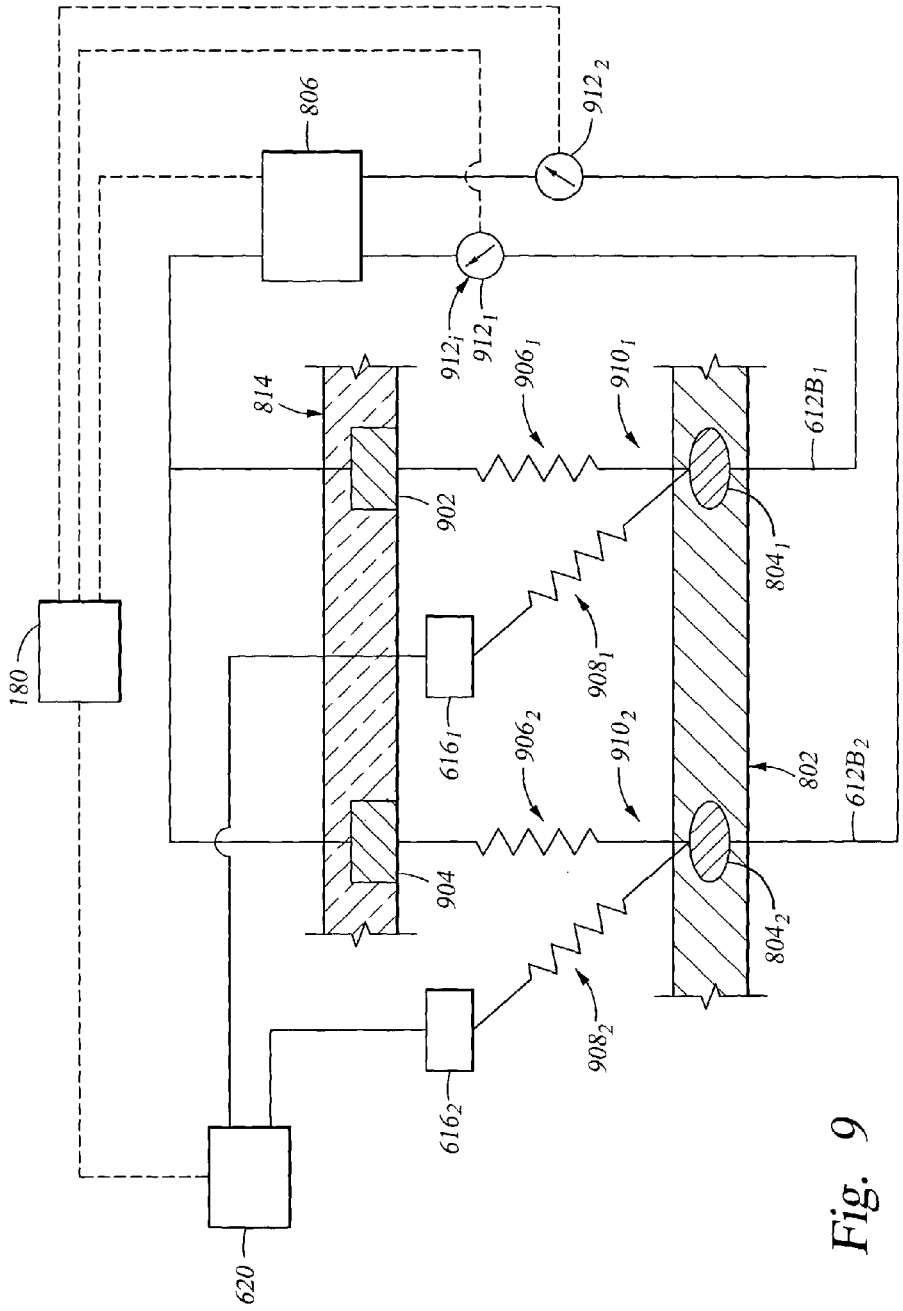
FIG. 9 a simplified partial electrical schematic of the processing cell of FIG. 8.

FIG. 9 is a simplified partial electrical schematic of the process cell 800. The substrate 814 is shown having a first conductive feature 902 and a second conductive feature 904. The conductive features 902, 904 are electrically coupled to the first power source 806 by the conductive pad assembly 606 (shown in FIG. 8) and biased relative to the counter electrode assembly 802.

A first conductive path $910_1$ is defined through the electrolyte disposed between the first conductive feature 902 and the first counter electrode $804_1$ of the counter electrode assembly 802. The first conductive path $910_1$ is comprised of two circuit branches $906_1$, $908_1$. The amount of current flowing through the first branch $906_1$ of the first conductive path $910_1$ is controlled in part by the potential applied by the first power source 806. As each counter electrode $804_i$ is independently controlled, the contribution to current flowing between the conductive features of the substrate 814 may be controlled across the width of the substrate. The current flowing through the first branch $906_1$ of the first conductive path $910_1$ is further regulated in response to a voltage applied by a second multiple output power source 620 to the first electrode $616_1$ as discussed above.

A second conductive path $910_2$ is similarly configured having a first circuit branch $906_2$ and a second circuit branch $908_2$. The amount of current flowing through the first branch $906_2$ of the second conductive path $910_2$ is further controlled in part by the potential applied by the first power source 806. The current flowing through the second branch $906_2$ of the second conductive path $910_2$ is regulated in response to a voltage applied to the second electrode $616_2$ by the second power source 620. As the second power source 620 independently controls the voltage to each electrode $616_i$, the current flowing through the first branch $906_i$ of each conductive path $910_i$ may be further tailored to independently control the relative rate of material removal from each conductive feature disposed across the width of the substrate 814.

Closed loop control of the processing is facilitated by a plurality of sensors $912_i$, one of which respectively coupled between each of the counter electrodes $804_i$ and the first power source 806. The sensors $912_i$, are coupled to a controller 180 and are configured to provide a metric indicative of the relative heights between respective conductive features positioned in series with a respective sensor $912_i$. Thus, in response to the metric provided by each of the sensors $912_i$, the controller 180 can vary the potential applied to each electrode $616_i$ and/or each counter electrode $804_i$ to control the rate of material removal across the width of the substrate 814.

Thus, the invention provides a method and apparatus for local polishing and deposition control in a process cell. In one embodiment, the apparatus provides for selectively polishing discrete conductive portions of a substrate that advantageously minimizes dishing commonly associated with conventional processes. It is contemplated that the process cell may be adapted for metal deposition by reversing the bias potential while utilizing appropriate chemistries.

While the foregoing is directed to the preferred embodiment of the present invention, other and further embodiments of the invention may be devised without departing from the basic scope thereof. The scope of the invention is determined by the claims that follow.

What is claimed is:

1. An apparatus for electrochemically processing a substrate, comprising:
   a pad support;
   a removable polishing pad assembly disposed on the pad support, the pad assembly comprising:
   a first counter electrode embedded in an insulator;
   at least a second counter electrode embedded in the insulator and disposed laterally adjacent to the first counter electrode, the first and second counter electrodes having a concentric planar orientation; and
   a conductive polishing surface that is adapted to process the substrate, the polishing surface having a plurality of apertures exposing the first counter electrode and the second counter electrode, wherein the first and second counter electrodes are independently electrically biasable relative to the conductive surface.

2. The apparatus of claim 1, wherein a portion of the insulator is disposed between the first counter electrode and the second counter electrode.

3. The apparatus of claim 1, wherein the first counter electrode belongs to a first set of counter electrodes and the second counter electrode belongs to a second set of counter electrodes, wherein the first set is electrically biasable independently from the second set of counter electrodes.

4. The apparatus of claim 3, wherein the first set of counter electrodes is disposed radially inward of the second set of counter electrodes.

5. The apparatus of claim 4, further comprising a third set of counter electrodes disposed radially outward of the second set of counter electrodes.

6. The apparatus of claim 1, wherein the first and the second counter electrodes are part of a plurality of counter electrodes arranged in a polar array.

7. The apparatus of claim 6, wherein the polar array of counter electrodes further comprises:
at least a third counter electrode that is radially aligned and electrically biasable independently from the first counter electrode.

8. The apparatus of claim 1 further comprising a local polishing rate indicator adapted to detect a metric indicative of differences in polishing rate across the substrate.

9. The apparatus of claim 8, wherein the local polishing rate indicator further comprises:
a plurality of sensors, each sensor coupled to a respective one of the counter electrodes.

10. The apparatus of claim 9, wherein at least one of the sensors is adapted to detect electrical current passing between the first counter electrode and the substrate.

11. The apparatus of claim 1, wherein the first counter electrode and the second counter electrode are removably disposed on the pad support.

12. The apparatus of claim 1, wherein the conductive polishing surface is configured to provide a uniform potential to the surface of the substrate.

13. An apparatus for electrochemically processing a substrate, comprising:
a counter electrode assembly having a plurality of concentrically arranged counter electrodes embedded in an insulator and disposed on a pad support, at least one of the plurality of counter electrodes independently electrically biasable relative to a second one of the counter electrodes;
a conductive polishing pad disposed on top of the plurality of counter electrodes, the conductive polishing pad having a first side adapted to polish the substrate and a second side facing the plurality of counter electrodes, where in the conductive polishing pad has a diameter substantially equal to that of the counter electrode assembly, the plurality of counter electrodes of the counter electrode assembly and the conductive pad forming a replaceable unitary replaceable assembly;
a housing adapted to support the substrate therein; and
an electrolyte delivery system adapted to provide an electrolyte adapted to provide a plurality of independently controlled electrical paths between the substrate and the plurality of counter electrodes through the conductive pad.

14. The apparatus of claim 13 further comprising a local polishing rate indicator adapted to detect a metric indicative of differences in polishing rate across the substrate.

15. The apparatus of claim 14, wherein the local polishing rate indicator further comprises:

a plurality of sensors, each sensor coupled to a respective one of the plurality of counter electrodes.

16. The apparatus of claim 15, wherein at least one of the sensors is adapted to detect electrical current between the counter electrode coupled to the sensor and the substrate.

17. The apparatus of claim 15 further comprising:
a multiple output power source, each of the plurality of counter electrodes coupled individually to one of the outputs.

18. The apparatus of claim 13, wherein the conductive polishing surface is configured to provide a uniform potential to the surface of the substrate.

19. An apparatus for electrochemically processing a substrate, comprising:
a pad support;
a counter electrode assembly having a plurality of independently biasable concentric counter electrodes embedded in an insulator and disposed on the pad support;
a polishing pad disposed on the counter electrode assembly opposite the pad support, the polishing pad having a diameter greater than a diameter of at least one of the counter electrodes, the polishing pad having a first side adapted to polish the substrate and a second side facing the at least one counter electrode;
a plurality of conductive members on the first side of the polishing pad, wherein the at least one counter electrode, polishing pad and conductive members form a unitary replaceable assembly; and
a plurality of independently controllable electrical paths laterally arranged and disposed between the conductive members and the counter electrodes.

20. The apparatus of claim 19, wherein each of the plurality of electrical pathways further comprises a respective one of the counter electrodes.

21. The apparatus of claim 20, wherein each of the plurality of electrical pathways is configured to control a local polishing rate and disposed between the respective counter electrode and the plurality of conductive members.

22. The apparatus of claim 21, wherein each of the electrodes is configured to control the local polishing rate by adjusting the a current flux to the substrate and is independently biasable.

23. An apparatus for electrochemically processing a substrate, comprising:
a pad support;
at least a first counter electrode embedded in an insulator and disposed on the pad support;
a conductive polishing pad disposed on the first counter electrode and having a first side adapted to process the substrate and a second side facing the first counter electrode, the polishing pad having a plurality of apertures; and
a plurality of independently biasable electrodes disposed between the counter electrode and the conductive polishing pad, the plurality of electrodes exposed to the first side of the polishing pad through the apertures, wherein the first counter electrode, the conductive polishing pad and the plurality of electrodes form a unitary replaceable assembly.

24. The apparatus of claim 23 further comprising:
at least a second counter electrode; and
a local polishing rate indicator adapted to detect a metric indicative of differences in polishing rate.

25. The apparatus of claim 24, wherein the local polishing rate indicator further comprises:
a first sensor coupled to the first counter electrode; and
a second sensor coupled to the second counter electrode.

26. The apparatus of claim 25, wherein the first sensor is adapted to detect at least one of electrical current or voltage potential between the first counter electrode and the substrate.

27. The apparatus of claim 23, wherein a portion of the insulator is disposed between the plurality of independently biasable electrodes.

28. The apparatus of claim 23 further comprising:
a first power source coupled between the polishing pad and the first counter electrode; and
a second power source coupled to the plurality of independently biasable electrodes.

29. The apparatus of claim 28, wherein the second power source has a plurality of outputs for independently biasing each of the plurality of independently biasable electrodes.

30. The apparatus of claim 29 further comprising:
a plurality of sensors, each sensor adapted to detect at least one of a current or a voltage potential between the counter electrode and ground.

31. An apparatus for electrochemically processing a substrate comprising:
a conductive polishing surface adapted to support the substrate in a position contacting a surface of the substrate with an electrolyte, the conductive polishing surface and substrate in contact therewith forming a first node;
at least one counter electrode embedded in an insulator and disposed approximate the polishing surface;
a plurality of concentrically arranged and independently biasable electrodes disposed between the polishing surface and the at least one counter electrode, the polishing surface, the counter electrode and the plurality of electrodes forming a unitary, replaceable pad assembly; and
a plurality of independently biasable electric circuits formed across the electrolyte and having a common node defined at the first node, wherein each of the plurality of electrodes is adapted to independently adjust a first local rate of the electrochemical processing relative to a second local rate of electrochemical processing proximate an adjacent electrode of the plurality of electrodes.

32. The apparatus of claim 31, further comprising a plurality of counter electrodes, each counter electrode is independently biasable.

* * * * *